(12) United States Patent
Su

(10) Patent No.: US 7,688,599 B2
(45) Date of Patent: Mar. 30, 2010

(54) LEAD FRAME MODULE FOR MANUFACTURING LIGHT EMITTING DIODES

(75) Inventor: Cheng-Hong Su, Taipei (TW)

(73) Assignees: Silitek Electronic (Guangzhou) Co., Ltd., Guangzhou (CN); Lite-On Technology Corp., Taipei (TW)

( * ) Notice: Subject to any disclaimer, the term of this patent is extended or adjusted under 35 U.S.C. 154(b) by 37 days.

(21) Appl. No.: 12/230,194

(22) Filed: Aug. 26, 2008

(65) Prior Publication Data

US 2009/0244875 A1 Oct. 1, 2009

(30) Foreign Application Priority Data

Mar. 25, 2008 (CN) .......................... 2008 1 0027088

(51) Int. Cl.
*H05K 5/02* (2006.01)

(52) U.S. Cl. ................ 361/813; 361/803; 361/772; 361/777; 361/774; 174/536; 174/250

(58) Field of Classification Search ................ 361/813, 361/803, 807, 772, 774–777; 174/250, 261, 174/268, 527, 528, 529, 536, 537, 541; 257/666, 257/670, 672, E23.066, E23.031, E23.043, 257/E23.05

See application file for complete search history.

(56) References Cited

U.S. PATENT DOCUMENTS

| 5,150,194 | A * | 9/1992 | Brooks et al. ............... 257/670 |
| 5,867,895 | A * | 2/1999 | Van Beneden et al. ........ 29/827 |
| 6,268,643 | B1 * | 7/2001 | Russell ....................... 257/666 |
| 2002/0119598 | A1 * | 8/2002 | Kawata et al. .............. 438/107 |
| 2004/0177984 | A1 * | 9/2004 | Groothuis et al. .......... 174/52.4 |
| 2005/0156300 | A1 * | 7/2005 | Johnson ...................... 257/678 |

\* cited by examiner

*Primary Examiner*—Jinhee J Lee
*Assistant Examiner*—Hoa C Nguyen
(74) *Attorney, Agent, or Firm*—Rosenberg, Klein & Lee

(57) ABSTRACT

A lead frame module integrally formed from a single thin metal sheet includes: parallel first and second rails extending in a first direction; and first and second lead frame sets connected to the first and second rails, respectively. The first and second lead frame sets respectively include a plurality of lead frames extending in a second direction perpendicular to the first direction. Each of the lead frames of the first and second lead frame sets has a pair of connecting leads and a pair of packaging leads. Each of the packaging leads is connected to a respective one of the connecting leads. The connecting leads of the lead frames of the first lead frame set are interdigitated with and are connected to the connecting leads of the lead frames of the second lead frame set.

15 Claims, 3 Drawing Sheets

LEAD FRAME MODULE FOR MANUFACTURING LIGHT EMITTING DIODES

CROSS-REFERENCE TO RELATED APPLICATION

This application claims priority of Chinese application no. 200810027088, filed on Mar. 25, 2008.

BACKGROUND OF THE INVENTION

1. Field of the Invention

This invention relates to a lead frame module, more particularly to a lead frame module for manufacturing light emitting diodes.

2. Description of the Related Art

Light emitting diodes (LEDs) have gained in popularity in recent years in view of their properties, e.g., relatively long service life, low contamination, low power consumption, etc. and are used in many fields, such as, indicator lamps of electronic devices, LED displays, a variety of lights, traffic signals, and so on. Thus, it is foreseeable that the applications of LEDs in the future would be wider, and accordingly, the demand for LEDs would further increase.

A LED is mainly constituted by a lead frame, a LED chip, some transparent resin for packaging, and so on. The lead frame is provided to function as a support and an electrical connection for the LED chip, and thus, is an indispensable element for the LED.

Furthermore, the LEDs can mainly be divided into two types, i.e., side view type LEDs and top view type LEDs, according to their packaging processes. Since the LEDs packaged according to different processes have different light-emitting directions, the lead frames, which support the LED chips for emitting light, in the two types of LEDs have different structures.

Usually, in order to increase the yield rate of LEDs, the LED packaging process is performed on a plurality of lead frames in a row, and not on a single lead frame, regardless of whether the LEDs are side view type LEDs or top view type LEDs. Thus, a lead frame module integrally formed from a single thin metal sheet by punching and having a plurality of lead frames arranged in a row is commonly used in this field.

For example, FIG. 1 illustrates a conventional lead frame module used in the side view type LEDs, and FIG. 2 illustrates a conventional lead frame module used in the top view type LEDs. In the lead frame module for manufacturing the side view type LEDs, and in the lead frame module for manufacturing top view type LEDs, there are a plurality of lead frames 92, 92' that are disposed in a row along the length of a locating-hole-providing rail 91, 91', that are parallel to one another, and that extend respectively from the rail 91, 91'.

Although the conventional lead frame modules are both provided with lead frames arranged in a row to increase the yield rate of LEDs, only about 20% of the thin metal sheets used for manufacturing are effectively utilized. The remaining 80% of the thin metal sheets would be regarded as waste. This is not desirable in this era of limited resources and causes environmental problems during waste disposal.

SUMMARY OF THE INVENTION

Therefore, the first object of the present invention is to provide a lead frame module for manufacturing light emitting diodes that can overcome the aforesaid drawbacks associated with the prior art. In other words, the area of the thin metal sheet that is effectively utilized can be promoted.

The second object of the present invention is to provide a lead frame module for manufacturing side view type light emitting diodes.

The third object of the present invention is to provide a lead frame module for manufacturing top view type light emitting diodes.

According to a first aspect of the present invention, there is provided a lead frame module for manufacturing light emitting diodes, the lead frame module being integrally formed from a single thin metal sheet, and comprising: a first rail extending in a first direction; a first lead frame set including a plurality of lead frames disposed along a length of the first rail, each of the lead frames of the first lead frame set being connected to the first rail and extending in a second direction perpendicular to the first direction; a second rail parallel to and spaced apart from the first rail; and a second lead frame set including a plurality of lead frames disposed along a length of the second rail, each of the lead frames of the second lead frame set being connected to the second rail and extending in the second direction; wherein each of the lead frames of the first and second lead frame sets has a pair of connecting leads for electrical connection and a pair of packaging leads for mounting a light emitting chip thereon, each of the packaging leads being connected to a respective one of the connecting leads; and wherein the connecting leads of the lead frames of the first lead frame set are interdigitated with and are connected to the connecting leads of the lead frames of the second lead frame set.

In one embodiment, the connecting leads of the lead frames of the first lead frame set are disposed one by one alternately with the connecting leads of the lead frames of the second lead frame set. Furthermore, each of the connecting leads of the lead frames of the first and second lead frame sets has two distal ends, one of which is connected to the first rail, and the other one of which is connected to the second rail.

In another embodiment, the pairs of connecting leads of the lead frames of the first lead frame set are disposed pair by pair alternately with the pairs of connecting leads of the lead frames of the second lead frame set.

According to a second aspect of the present invention, there is provided a lead frame module for manufacturing side view type light emitting diodes, the lead frame module being integrally formed from a single thin metal sheet, and comprising: a first rail extending in a first direction; a first lead frame set including a plurality of lead frames disposed along a length of the first rail, each of the lead-frames of the first lead frame set being connected to the first rail and extending in a second direction perpendicular to the first direction; a second rail parallel to and spaced apart from the first rail; a second lead frame set including a plurality of lead frames disposed along a length of the second rail, each of the lead frames of the second lead frame set being connected to the second rail and extending in the second direction; first and second locating-hole-providing rails extending respectively in the first direction with the first and second rails disposed therebetween; a plurality of third rails extending in the second direction and connecting the first locating-hole-providing rail to the first rail; and a plurality of fourth rails extending in the second direction and connecting the second locating-hole-providing rail to the second rail; wherein each of the lead frames of the first and second lead frame sets has a pair of connecting leads for electrical connection and a pair of packaging leads for mounting a light emitting chip thereon, each of the packaging leads being connected to a respective one of the connecting leads; and wherein the connecting leads of the lead frames of the first lead frame set are interdigitated with and are connected to the connecting leads of the lead frames of the second lead frame set.

Preferably, the connecting leads of the lead frames of the first lead frame set are disposed one by one alternately with the connecting leads of the lead frames of the second lead frame set.

According to a third aspect of the present invention, there is provided a lead frame module for manufacturing top view type light emitting diodes, the lead frame module being integrally formed from a single thin metal sheet, and comprising: a first rail extending in a first direction; a first lead frame set including a plurality of lead frames disposed along a length of the first rail, each of the lead frames of the first lead frame set being connected to the first rail and extending in a second direction perpendicular to the first direction; a second rail parallel to and spaced apart from the first rail; a second lead frame set including a plurality of lead frames disposed along a length of the second rail, each of the lead frames of the second lead frame set being connected to the second rail and extending in the second direction; and a third rail extending in the first direction between the first and second rails; wherein each of the lead frames of the first and second lead frame sets has a pair of connecting leads for electrical connection, each of which is connected to the third rail, and a pair of packaging leads for mounting a light emitting chip thereon, each of the packaging leads being connected to a respective one of the connecting leads; and wherein the connecting leads of the lead frames of the first lead frame set are interdigitated with the connecting leads of the lead frames of the second lead frame set.

Preferably, the pairs of connecting leads of the lead frames of the first lead frame set are disposed pair by pair alternately with the pairs of connecting leads of the lead frames of the second lead frame set.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
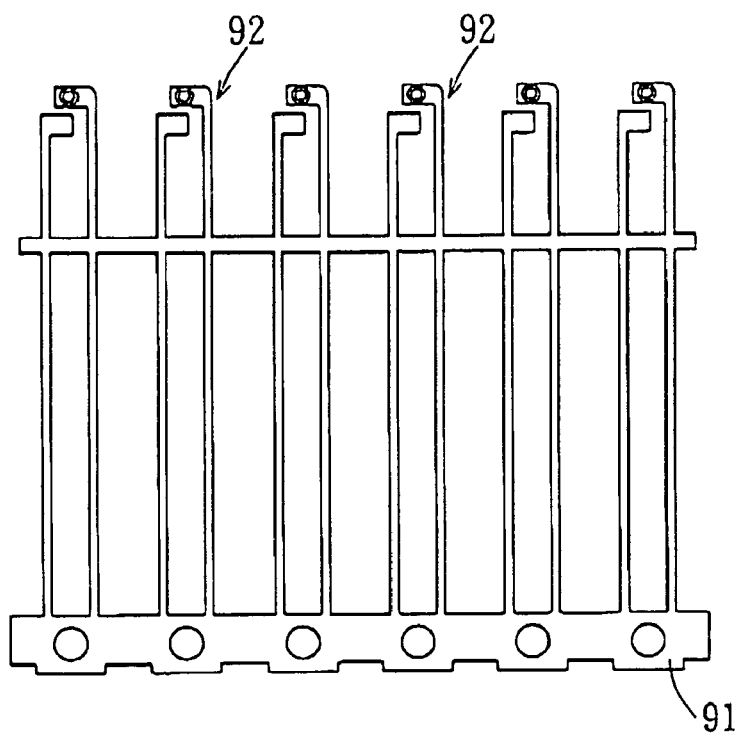
FIG. 1 is a plan view of a conventional lead frame module used in side view type LEDs.
Figure 2:
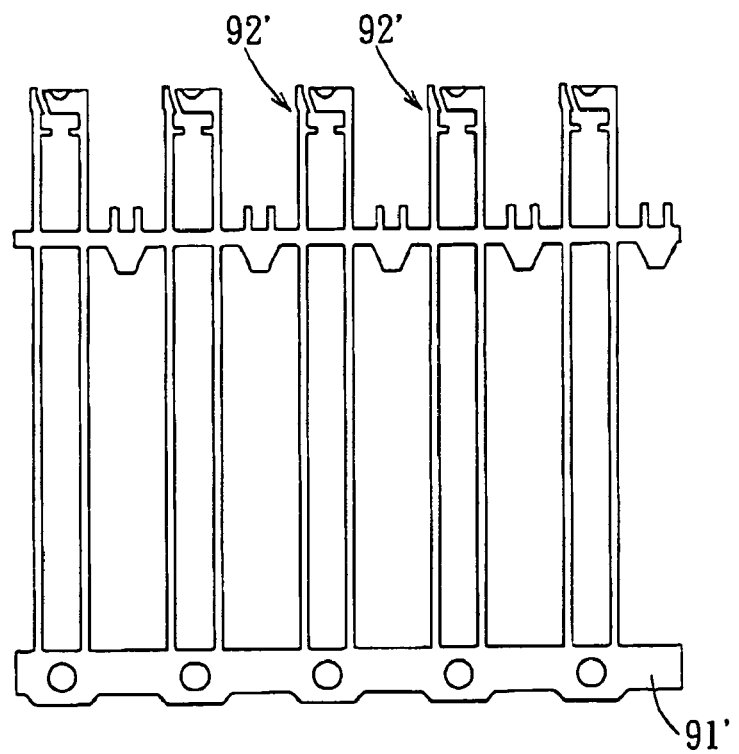
FIG. 2 is a plan view of a conventional lead frame module used in top view type LEDs.
Figure 3:
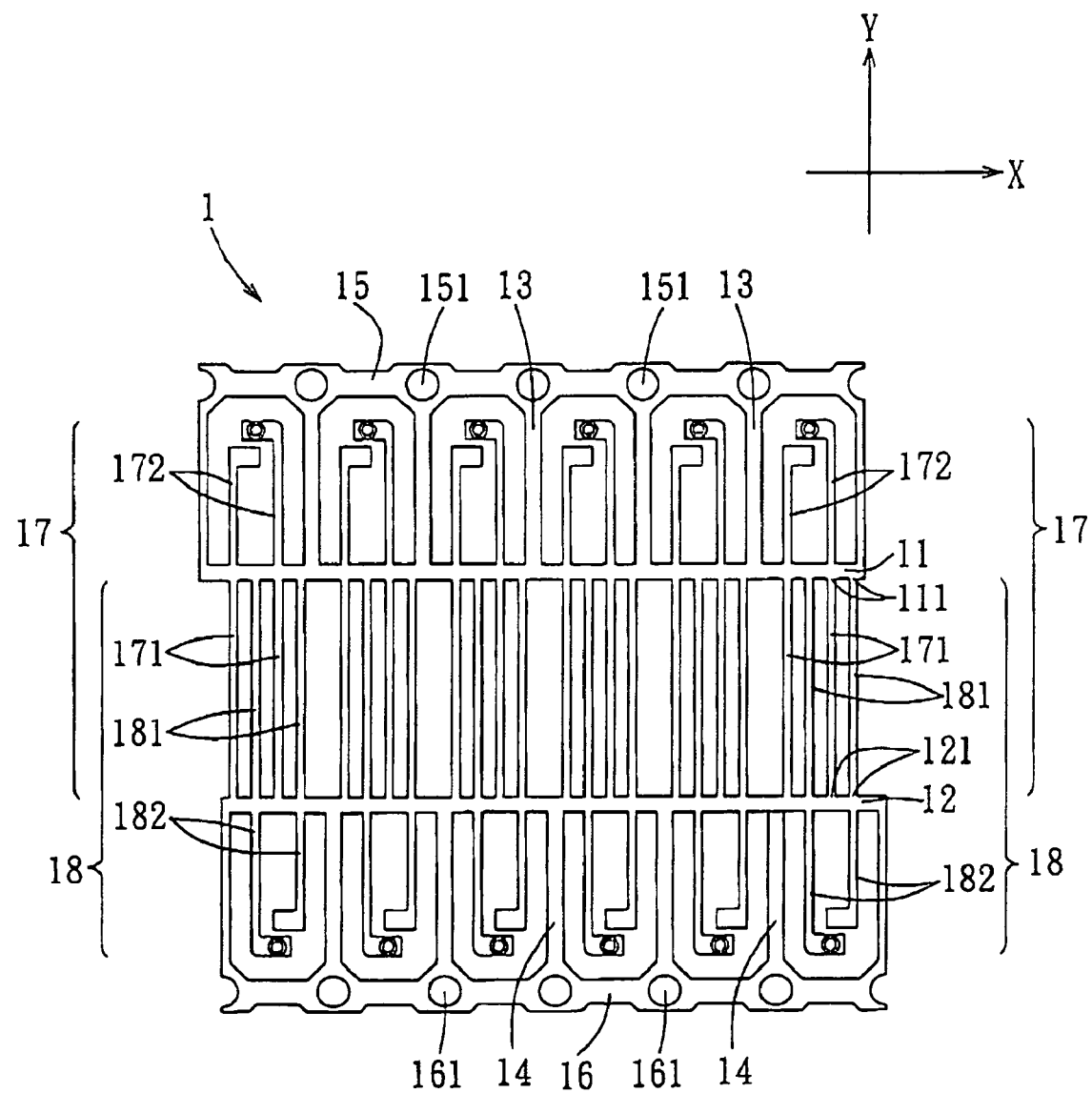
FIG. 3 is a plan view of a lead frame module for manufacturing side view type LEDs of the first preferred embodiment according to the present invention.
Figure 4:
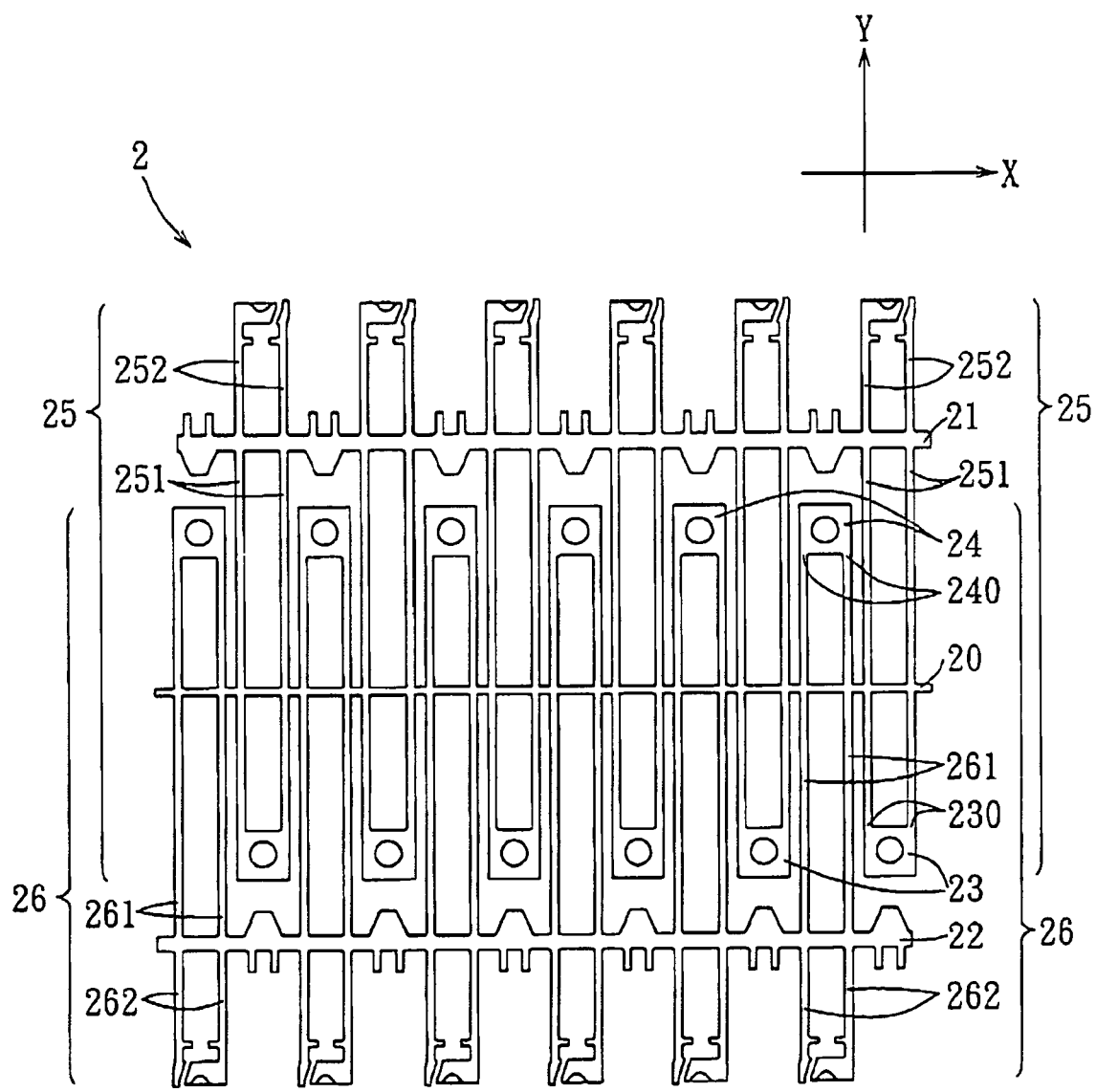
FIG. 4 is a plan view of a lead frame module for manufacturing top view type LEDs of the second preferred embodiment according to the present invention.

FIG. 3 illustrates a lead frame module 1 for manufacturing side view type LEDs of the first preferred embodiment according to the present invention. FIG. 4 illustrates a lead frame module 2 for manufacturing top view type LEDs of the second preferred embodiment according to the present invention. Any of the lead frame modules 1, 2 is a part cut from a long thin metal sheet, the part having a suitable length for a packaging apparatus, and having a pattern of a plurality of lead frames formed therewith. The pattern is formed repeatedly by punching while the long thin metal sheet is rolled down stepwise from a coil stock along an X direction (i.e., the first direction) in FIGS. 3 and 4. In other words, both of the lead frame module 1 for manufacturing side view type LEDs in the first preferred embodiment and the lead frame module 2 for manufacturing top view type LEDs in the second preferred embodiment are integrally formed from a single thin metal sheet.

The lead frame module 1 for manufacturing side view type LEDs of the first preferred embodiment will now be described.

Referring to FIG. 3, the lead frame module 1 for manufacturing side view type LEDs is shown to include a first rail 11, a first lead frame set 17, a second rail 12, a second lead frame set 18, first and second locating-hole-providing rails 15, 16, a plurality of third rails 13, and a plurality of fourth rails 14.

The first and second rails 11, 12 extend in a first direction (X) and are spaced apart from each other.

The first lead frame set 17 includes a plurality of lead frames disposed along a length of the first rail 11. Each of the lead frames of the first lead frame set 17 is connected to the first rail 11 and extends in a second direction (Y) perpendicular to the first direction (X). Each of the lead frames of the first lead frame set 17 has a pair of connecting leads 171 for electrical connection, and a pair of packaging leads 172 for mounting a light emitting chip (not shown) thereon. Each of the packaging leads 172 is connected to a respective one of the connecting leads 171 via the first rail 11.

The second lead frame set 18 includes a plurality of lead frames disposed along a length of the second rail 12. Each of the lead frames of the second lead frame set 18 is connected to the second rail 12 and extends in the second direction (Y) perpendicular to the first direction (X). Each of the lead frames of the second lead frame set 18 has a pair of connecting leads 181 for electrical connection, and a pair of packaging leads 182 for mounting a light emitting chip (not shown) thereon. Each of the packaging leads 182 is connected to a respective one of the connecting leads 181 via the second rail 12.

In the first preferred embodiment, each of the connecting leads 171, 181 of the lead frames of the first and second lead frame sets 17, 18 has two distal ends 111, 121. The distal end 111 is connected to the first rail 11. The distal end 121 is connected to the second rail 12. That is to say, the connecting leads 171 of the lead frames of the first lead frame set 17 are connected to the connecting leads 181 of the lead frames of the second lead frame set 18 via the first and second rails 11, 12.

The first and second locating-hole-providing rails 15, 16 extend respectively in the first direction (X) with the first and second rails 11, 12 disposed therebetween. In detail, the first and second locating-hole-providing rails 15, 16 respectively have a plurality of locating-holes 151, 161 spaced apart from each other along the first direction (X).

The third rails 13 extend in the second direction (Y), are spaced apart from each other, and connect the first locating-hole-providing rail 15 to the first rail 11. Furthermore, the packaging leads 172 of the lead frames of the first lead frame set 17 are disposed between the first rail 11 and the first locating-hole-providing rail 15 and are partitioned in pairs by the third rails 13.

The fourth rails 14 extend in the second direction (Y), are spaced apart from each other, and connect the second locating-hole-providing rail 16 to the second rail 12. Furthermore, the packaging leads 182 of the lead frames of the second lead frame set 18 are disposed between the second rail 12 and the second locating-hole-providing rail 16 and are partitioned in pairs by the fourth rails 14.

It should be noted that the connecting leads 171 of the lead frames of the first lead frame set 17 are disposed one by one alternately with the connecting leads 181 of the lead frames of the second lead frame set 18, i.e., the connecting leads 171 are interdigitated with the connecting leads 181. By such an arrangement, the layout of the lead frame module 1 for manufacturing side view type LEDs of the first preferred embodiment according to the present invention is much more dense compared to that of the conventional lead frame module. Therefore, the area of the thin metal sheet that is effectively utilized can be promotes by the present invention.

Furthermore, since the packaging process of the side view type LEDs is performed from the direction perpendicular to the plane defined by the first and second directions (X, Y) for all of the packaging leads 172, 182 of the lead frame module 1 at one time, it is not necessary to segment the lead frame module 1 into two parts respectively having a single lead frame set 17, 18 prior to packaging, and the packaging process on the whole lead frame module 1 can be performed at one time using a conventional packaging apparatus.

The lead frame module 2 for manufacturing top view type LEDs of the second preferred embodiment will now be described in the following.

As shown in FIG. 4, the lead frame module 2 for manufacturing top view type LEDs is shown to include a first rail 21, a first lead frame set 25, a second rail 22, a second lead frame set 26, a third rail 20, a plurality of first locating-hole-providing parts 23, and a plurality of second locating-hole-providing parts 24

The first and second rails 21, 22 extend in a first direction (X) and are spaced apart from each other.

The first lead frame set 25 includes a plurality of lead frames disposed along a length of the first rail 21. Each of the lead frames of the first lead frame set 25 is connected to the first rail 21 and extends in a second direction (Y) perpendicular to the first direction (X). Each of the lead frames of the first lead frame set 25 has a pair of connecting leads 251 for electrical connection, and a pair of packaging leads 252 for mounting a light emitting chip (not shown) thereon. Each of the connecting leads 251 of each of the lead frames of the first lead frame set 25 has a first end part 230 distal from the first rail 21. The first end parts 230 of each of the pair of connecting leads 251 of each of the lead frames of the first lead frame set 25 are connected together via a respective one of the first locating-hole-providing parts 23.

The second lead frame set 26 includes a plurality of lead frames disposed along a length of the second rail 22. Each of the lead frames of the second lead frame set 26 is connected to the second rail 22 and extends in the second direction (Y) perpendicular to the first direction (X). Each of the lead frames of the second lead frame set 26 has a pair of connecting leads 261 for electrical connection, and a pair of packaging leads 262 for mounting a light emitting chip (not shown) thereon. Each of the connecting leads 261 of each of the lead frames of the second lead frame set 26 has a second end part 240 distal from the second rail 22. The second end parts 240 of each of the pair of connecting leads 261 of each of the lead frames of the second lead frame set 26 are connected together via a respective one of the second locating-hole-providing parts 24.

The third rail 20 extends in the first direction (X) between the first and second rails 21, 22, and connects the connecting leads 251, 261 of the lead frames of the first and second lead frame sets 25, 26 in a way that the first and second locating-hole-providing parts 23, 24 are disposed along opposite sides of the third rail 20.

In this embodiment, the pairs of connecting leads 251 of the lead frames of the first lead frame set 25 are disposed pair by pair alternately with the pairs of connecting leads 261 of the lead frames of the second lead frame set 26, i.e., the connecting leads 251 are interdigitated with the connecting leads 261. By such an arrangement, the layout of the lead frame module 2 for manufacturing top view type LEDs of the second preferred embodiment according to the present invention is much more dense compared to that of the conventional lead frame module. Therefore, the area of the thin metal sheet that is effectively utilized can be promoted by the present invention.

Furthermore, since the packaging process of the top view type LEDs is performed from the second direction (Y) toward one of the end faces of the packaging leads 252, 262 of the first and second lead frame sets 25, 26 of the lead frame module 2 at one time, it is necessary to segment the lead frame module 2 into two parts respectively having a single lead frame set 25, 26 prior to performing the packaging process on one of the first and second lead frame sets 25, 26 of the lead frame module 2 using a conventional packaging apparatus.

The layout concerning the first and second lead frame sets 17, 18 of the lead frame module 1 for manufacturing side view type LEDs of the first preferred embodiment can also be arranged to be similar that of the second preferred embodiment.

It is noted herein that the verb "interdigitate" as used in this specification means elements being alternately disposed "one by one," or "pair by pair."

By the arrangement that, in one lead frame module, the connecting leads of the first and second lead frame set are interdigitated with each other, the area of the thin metal sheet that is effectively utilized can be promoted, the efficiency for the punching process can be improved, and the cost for each lead frame can be further reduced.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A lead frame module for manufacturing light emitting diodes, said lead frame module being integrally formed from a single thin metal sheet, and comprising:

a first rail extending in a first direction;

a first lead frame set including a plurality of lead frames disposed along a length of said first rail, each of said lead frames of said first lead frame set being connected to said first rail and extending in a second direction perpendicular to the first direction;

a second rail parallel to and spaced apart from said first rail; and a second lead frame set including a plurality of lead frames disposed along a length of said second rail, each of said lead frames of said second lead frame set being connected to said second rail and extending in the second direction;

wherein each of said lead frames of said first and second lead frame sets has a pair of connecting leads for electrical connection and a pair of packaging leads for mounting a light emitting chip thereon, each of said packaging leads being connected to a respective one of said connecting leads; and wherein said connecting leads of said lead frames of said first lead frame set are interdigitated with and are connected to said connecting leads of said lead frames of said second lead frame set.

2. The lead frame module of claim 1,
wherein said connecting leads of said lead frames of said first lead frame set are disposed one by one alternately with said connecting leads of said lead frames of said second lead frame set, and
wherein each of said connecting leads of said lead frames of said first and second lead frame sets has two distal ends, one of which is connected to said first rail, and the other one of which is connected to said second rail.

3. The lead frame module of claim 2, further comprising:
first and second locating-hole-providing rails extending respectively in the first direction with said first and second rails disposed therebetween;
a plurality of third rails extending in the second direction and connecting said first locating-hole-providing rail to said first rail; and
a plurality of fourth rails extending in the second direction and connecting said second locating-hole-providing rail to said second rail;
wherein said packaging leads of said lead frames of said first lead frame set are disposed between said first rail and said first locating-hole-providing rail; and
wherein said packaging leads of said lead frames of said second lead frame set are disposed between said second rail and said second locating-hole-providing rail.

4. The lead frame module of claim 3,
wherein said packaging leads of said lead frames of said first lead frame set are partitioned in pairs by said third rails, and
wherein said packaging leads of said lead frames of said second lead frame set are partitioned in pairs by said fourth rails.

5. The lead frame module of claim 1, wherein said pairs of connecting leads of said lead frames of said first lead frame set are disposed pair by pair alternately with said pairs of connecting leads of said lead frames of said second lead frame set.

6. The lead frame module of claim 5, further comprising a plurality of first locating-hole-providing parts and a plurality of second locating-hole-providing parts,
wherein each of said connecting leads of each of said lead frames of said first lead frame set has a first end part distal from said first rail, said first end parts of each of said pair of connecting leads of each of said lead frames of said first lead frame set being connected together via a respective one of said first locating-hole-providing parts, and
wherein each of said connecting leads of each of said lead frames of said second lead frame set has a second end part distal from said second rail, said second end parts of each of said pair of connecting leads of each of said lead frames of said second lead frame set being connected together via a respective one of said second locating-hole-providing parts.

7. The lead frame module of claim 6, wherein said first and second locating-hole-providing parts are disposed between said first and second rails.

8. The lead frame module of claim 7, further comprising:
a third rail that extends in the first direction, and that connects said connecting leads of said lead frames of said first and second lead frame sets in a way that said first and second locating-hole-providing parts are disposed along opposite sides of said third rail.

9. A lead frame module for manufacturing side view type light emitting diodes, said lead frame module being integrally formed from a single thin metal sheet, and comprising:
a first rail extending in a first direction;
a first lead frame set including a plurality of lead frames disposed along a length of said first rail, each of said lead frames of said first lead frame set being connected to said first rail and extending in a second direction perpendicular to the first direction;
a second rail parallel to and spaced apart from said first rail;
a second lead frame set including a plurality of lead frames disposed along a length of said second rail, each of said lead frames of said second lead frame set being connected to said second rail and extending in the second direction;
first and second locating-hole-providing rails extending respectively in the first direction with said first and second rails disposed therebetween;
a plurality of third rails extending in the second direction and connecting said first locating-hole-providing rail to said first rail; and
a plurality of fourth rails extending in the second direction and connecting said second locating-hole-providing rail to said second rail;
wherein each of said lead frames of said first and second lead frame sets has a pair of connecting leads for electrical connection and a pair of packaging leads for mounting a light emitting chip thereon, each of said packaging leads being connected to a respective one of said connecting leads; and
wherein said connecting leads of said lead frames of said first lead frame set are interdigitated with and are connected to said connecting leads of said lead frames of said second lead frame set.

10. The lead frame module of claim 9,
wherein said connecting leads of said lead frames of said first lead frame set are disposed one by one alternately with said connecting leads of said lead frames of said second lead frame set, and
wherein each of said connecting leads of said lead frames of said first and second lead frame sets has two distal ends, one of which is connected to said first rail, and the other one of which is connected to said second rail.

11. The lead frame module of claim 10,
wherein said packaging leads of said lead frames of said first lead frame set are disposed between said first rail and said first locating-hole-providing rail and are partitioned in pairs by said third rails, and
wherein said packaging leads of said lead frames of said second lead frame set are disposed between said second rail and said second locating-hole-providing rail and are partitioned in pairs by said fourth rails.

12. A lead frame module for manufacturing top view type light emitting diodes, said lead frame module being integrally formed from a single thin metal sheet, and comprising:
a first rail extending in a first direction;
a first lead frame set including a plurality of lead frames disposed along a length of said first rail, each of said lead frames of said first lead frame set being connected to said first rail and extending in a second direction perpendicular to the first direction;
a second rail parallel to and spaced apart from said first rail;
a second lead frame set including a plurality of lead frames disposed along a length of said second rail, each of said lead frames of said second lead frame set being connected to said second rail and extending in the second direction; and a third rail extending in the first direction between said first and second rails;

wherein each of said lead frames of said first and second lead frame sets has a pair of connecting leads for electrical connection, each of which is connected to said third rail, and a pair of packaging leads for mounting a light emitting chip thereon, each of said packaging leads being connected to a respective one of said connecting leads; and wherein said connecting leads of said lead frames of said first lead frame set are interdigitated with said connecting leads of said lead frames of said second lead frame set.

13. The lead frame module of claim 12, wherein said pairs of connecting leads of said lead frames of said first lead frame set are disposed pair by pair alternately with said pairs of connecting leads of said lead frames of said second lead frame set.

14. The lead frame module of claim 13, further comprising a plurality of first locating-hole-providing parts and a plurality of second locating-hole-providing parts, wherein each of said connecting leads of each of said lead frames of said first lead frame set has a first end part distal from said first rail, said first end parts of each of said pair of connecting leads of each of said lead frames of said first lead frame set being connected together via a respective one of said first locating-hole-providing parts, and wherein each of said connecting leads of each of said lead frames of said second lead frame set has a second end part distal from said second rail, said second end parts of each of said pair of connecting leads of each of said lead frames of said second lead frame set being connected together via a respective one of said second locating-hole-providing parts.

15. The lead frame module of claim 14, wherein said first and second locating-hole-providing parts are disposed between said first and second rails, and wherein said third rail is disposed in a way that said first and second locating-hole-providing parts are along opposite sides of said third rail.

* * * * *